United States Patent
Kyung et al.

(10) Patent No.: US 7,555,694 B2
(45) Date of Patent: Jun. 30, 2009

(54) CHANNEL INTERLEAVING/DE-INTERLEAVING APPARATUS IN A COMMUNICATION SYSTEM USING A LOW DENSITY PARITY CHECK CODE AND CONTROL METHOD THEREOF

(75) Inventors: Gyu-Bum Kyung, Suwon-si (KR);
Seung-Hoon Choi, Suwon-si (KR);
Jae-Yoel Kim, Suwon-si (KR);
Sung-Eun Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 517 days.

(21) Appl. No.: 11/370,288

(22) Filed: Mar. 8, 2006

(65) Prior Publication Data
US 2006/0218461 A1    Sep. 28, 2006

(30) Foreign Application Priority Data
Mar. 11, 2005    (KR) ...................... 10-2005-0020750

(51) Int. Cl.
*H03M 13/00*    (2006.01)
(52) U.S. Cl. ..................... 714/755; 714/786; 714/788; 714/762; 714/781
(58) Field of Classification Search ................. 714/755, 714/785–786, 781, 758, 788, 762, 782
See application file for complete search history.

(56) References Cited

U.S. PATENT DOCUMENTS

2007/0033486 A1 *    2/2007   Hong et al. .................. 714/758
2007/0283216 A1 *    12/2007  Kyung et al. ................. 714/758

FOREIGN PATENT DOCUMENTS

EP    1 387 496    2/2004

(Continued)

OTHER PUBLICATIONS

Ba-Zhong Shen et al., Low-Density Parity-Check Coded Modulation Using Multiple Signal Maps and Symbol Decoding, IEEE International Conference on Communications, Jun. 20, 2004; pp. 420-424.

(Continued)

*Primary Examiner*—Guy J Lamarre
(74) *Attorney, Agent, or Firm*—The Farrell Law Firm, LLP (57) ABSTRACT

In a communication system, information data bits are encoded in a preset coding scheme when the information data bits are input, and a Low Density Parity Check (LDPC) codeword is generated. The LDPC codeword is interleaved according to a preset channel-interleaving rule. A channel-interleaved LDPC codeword is modulated in a preset modulation scheme and a modulation symbol is generated.

25 Claims, 5 Drawing Sheets

FOREIGN PATENT DOCUMENTS

| | | |
|---|---|---|
| JP | 2005-039585 | 2/2005 |
| JP | 2005-277784 | 10/2005 |
| WO | WO 2005/020500 | 3/2005 |
| WO | WO 2005/048460 | 5/2005 |
| WO | WO 2005/060141 | 6/2005 |

OTHER PUBLICATIONS

H. Sankar et al., Design of Low-Density Parity-Check (LDPC) Codes for High Order Constellations, IEEE Global Telecommunications Conference, Nov. 29, 2004, pp. 3113-3117.

Digital Video Broadcasting (DVB); Second Generation Framing Structure, Channel Coding and Modulation Systems for Broadcasting, Interactive Services, News Gathering and Other Broadband Satellite Applications, Jan. 2005, pp. 1-74.

Jun Tan et al., Analysis and Design of Interleaver Mappings for Iteratively Decoded BICM, IEEE International Conference on Communications, Apr. 28, 2002, pp. 1403-1407.

S. H. Schremmer, Low Density Parity Check Codes in a Frequency Hopped Communication System With Partial-Band Interference, IEEE Military Communications Conference, Oct. 7, 2002, pp. 895-899.

M. Yang et al., Performance of (Quasi-)Cyclic LDPC Codes in Noise Bursts on the EPR4 Channel, IEEE Global Telecommunications Conference, Nov. 25, 2001, pp. 2961-2965.

\* cited by examiner $$H = \begin{bmatrix} 1 & 0 & 1 & 0 & 1 & 0 & 1 & 0 \\ 1 & 0 & 0 & 1 & 0 & 1 & 0 & 1 \\ 0 & 1 & 1 & 0 & 0 & 1 & 1 & 0 \\ 0 & 1 & 0 & 1 & 1 & 0 & 0 & 1 \end{bmatrix}$$

$$H = \begin{bmatrix} 1 & 0 & 1 & 0 & 1 & 1 & 1 & 1 \\ 1 & 0 & 1 & 1 & 0 & 1 & 1 & 1 \\ 0 & 1 & 1 & 1 & 1 & 1 & 0 & 1 \\ 0 & 1 & 0 & 1 & 1 & 0 & 1 & 1 \\ 0 & 0 & 0 & 0 & 1 & 1 & 1 & 1 \end{bmatrix}$$

$$H' = \begin{bmatrix} 1 & 0 & 1 & 1 & 1 & 0 & 1 & 1 \\ 1 & 0 & 0 & 1 & 1 & 1 & 1 & 1 \\ 0 & 1 & 1 & 1 & 1 & 1 & 0 & 1 \\ 0 & 1 & 1 & 0 & 0 & 1 & 1 & 1 \\ 0 & 0 & 1 & 1 & 0 & 0 & 1 & 1 \end{bmatrix}$$

CHANNEL INTERLEAVING/DE-INTERLEAVING APPARATUS IN A COMMUNICATION SYSTEM USING A LOW DENSITY PARITY CHECK CODE AND CONTROL METHOD THEREOF

PRIORITY

This application claims priority under 35 U.S.C. § 119 to an application filed in the Korean Intellectual Property Office on Mar. 11, 2005 and assigned Serial No. 2005-20750, the contents of which are incorporated herein by reference.

BACKGROUND OF THE INVENTION

1. Field of the Invention

The present invention relates generally to a channel interleaving/deinterleaving apparatus and a control method thereof, and in particular to a channel interleaving/deinterleaving apparatus in a communication system using a Low Density Parity Check (LDPC) code and a control method thereof.

2. Description of the Related Art

The rapid growth of a mobile communication system has created a need for development of technology for transmitting a large amount of data in wireless networks in a capacity level parallel to that of wired networks. This requires a high-speed, high-capacity communication system capable of processing and transmitting various information such as image data, radio data, as well as voice-centric service. Therefore, it is necessary to increase the system transmission efficiency using an appropriate channel coding scheme in order to improve the system performance. However, a mobile communication system inevitably experiences errors occurring due to a number of factors including noise, interference, fading, and channel conditions during data transmission. These errors may cause a loss of information data.

Reliability of the mobile communication system can be improved by using various error-control schemes based on channel characteristics to reduce the information data loss due to the occurrence of errors. The most widely used error-control technology uses an error-correcting code. A description will now be given of a Turbo Code and a Low Density Parity Check (LDPC) code serving as typical error-correcting codes.

It is well known that the Turbo Code is superior in performance gain to a Convolutional Code conventionally used for error correction, at the time of high-speed data transmission. The Turbo Code is advantageous in that it can efficiently correct an error caused by noise occurring in a transmission channel, thereby improving the reliability of data transmission. The LDPC code can be decoded using an iterative decoding algorithm based on a sum-product algorithm on a factor graph. Given that a decoder for the LDPC code uses the sum-product algorithm-based iterative decoding algorithm, it has a lower complexity than a decoder for the Turbo Code. In addition, the decoder for the LDPC code is more easily implemented as a parallel processing decoder, as compared with the decoder for the Turbo Code.

Shannon's channel coding theorem shows that reliable communication is possible only at a data rate not exceeding a channel capacity. However, Shannon's channel coding theorem proposes no detailed channel encoding/decoding method for supporting a data rate equivalent to the maximum channel capacity limit. Although a random code having a very large block size generally shows performance approximating a channel capacity limit of Shannon's channel coding theorem, when a Maximum A Posteriori (MAP) or Maximum Likelihood (ML) decoding scheme is used, it is not possible to implement the decoding scheme because of its heavy computation load.

The Turbo Code was proposed by Berrou, Glavieux, and Thitimajshima in 1993, and it has superior performance for approximating a channel capacity limit of Shannon's channel coding theorem. The proposal for use of the Turbo Code triggered active research on iterative decoding and graphical expression of codes. LDPC codes proposed by Gallager in 1962 have been newly spotlighted in that research. Cycles exist on a factor graph of the Turbo Code and the LDPC code, and it is well known that iterative decoding on the factor graph of the LDPC code where cycles exist is sub-optimal. The term "cycle" refers to a loop formed by edges connecting the variable nodes to the check nodes in a factor graph of a LDPC Code, and a length of the cycle is defined as the number of edges forming the loop. It has also been proven through experiments that the LDPC code has excellent performance through iterative decoding. The LDPC code known to have the highest performance ever shows performance having a difference of only about 0.04 [dB] at a channel capacity limit of Shannon's channel coding theorem at a Bit Error Rate (BER) of $10^{-5}$, using a block size of $10^7$. In addition, although an LDPC code defined in Galois Field (GF) with q>2, i.e., GF(q) increases in complexity in its decoding process, it is much superior in performance to a binary code. However, there has been provided no satisfactory theoretical description of successful decoding by an iterative decoding algorithm for the LDPC code defined in GF (q).

The LDPC code proposed by Gallager is defined by a parity check matrix in which major elements have a value of 0 and minor elements except for the elements having the value of 0 have a value of 1. For example, an (N, j, k) LDPC code is a Linear Block code having a block length N, and is defined by a sparse parity check matrix in which each column has j elements having a value of 1, each row has k elements having a value of 1, and all of the elements except for the elements having the value of 1 all have a value of 0.

A regular LDPC code is an LDPC code in which a weight of each column in the parity check matrix is fixed to j and a weight of each row in the parity check matrix is fixed to k. Herein, the term "weight" refers to the number of elements having a non-zero value among the elements forming a generation matrix and a parity check matrix. Unlike the regular LDPC code, an irregular LDPC code is an LDPC code in which the weight of each column in the parity check matrix or the weight of each row in the parity check matrix is not fixed. It is generally known that the irregular LDPC code outperforms the regular LDPC code. In the irregular LDPC code the weight of each column or the weight of each row in the parity check matrix are not fixed, they are irregular. Consequently, the weight of each column in the parity check matrix or the weight of each row in the parity check matrix must be properly adjusted in order to guarantee the superior performance of the irregular LDPC code.

Figure 1:
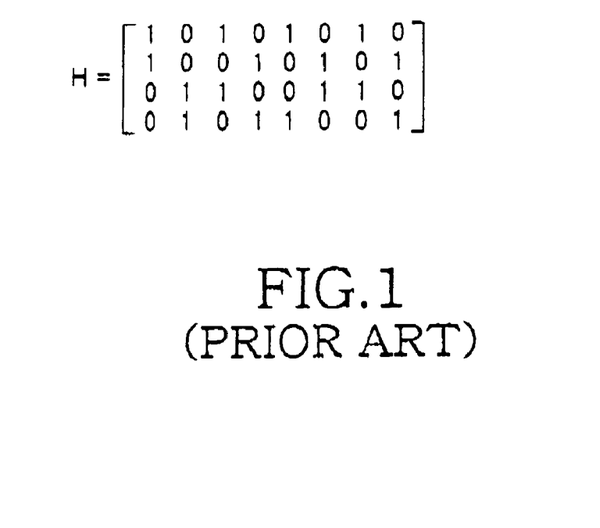
FIG. 1 illustrates a parity check matrix of a general (8, 2, 4) Low Density Parity Check (LDPC) code.

Referring to FIG. 1, a below is description of a parity check matrix of an (8, 2, 4) LDPC code as an example of an (N, j, k) LDPC code.

FIG. 1 illustrates a parity check matrix of a general (8, 2, 4) LDPC code.

Referring to FIG. 1, a parity check matrix H of the (8, 2, 4) LDPC code includes 8 columns and 4 rows in which a weight of each column is fixed to 2 and a weight of each row is fixed to 4. Since the weight of each column and the weight of each row in the parity check matrix are regular, the (8, 2, 4) LDPC code illustrated in FIG. 1 becomes a regular LDPC code.

Figure 2:
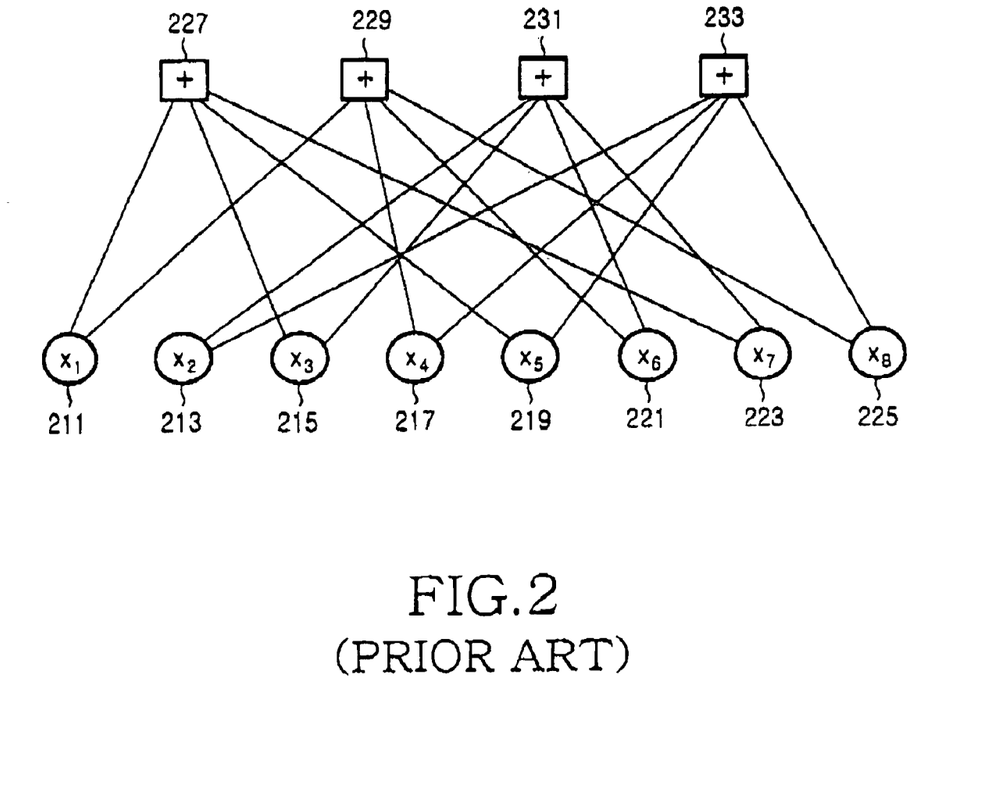
FIG. 2 illustrates a factor graph of the (8, 2, 4) LDPC code of FIG. 1.

FIG. 2 illustrates a factor graph of the (8, 2, 4) LDPC code of FIG. 1. Referring to FIG. 2, the factor graph of the (8, 2, 4) LDPC code includes 8 variable nodes of $x_1$ 211, $x_2$ 213, $x_3$ 215, $x_4$ 217, $x_5$ 219, $x_6$ 221, $x_7$ 223, and $x_8$ 225, and 4 check nodes 227, 229, 231, and 233. When an element having a value of 1, i.e., a non-zero value, exists at a point where an $i^{th}$ row and a $j^{th}$ column of the parity check matrix of the (8, 2, 4) LDPC code cross each other, a branch is created between a variable node $x_i$ and a $j^{th}$ check node.

Because the parity check matrix of the LDPC code has a very small weight as described above, it is possible to perform iterative decoding even in a Block code having a relatively long length, that exhibits performance approximating a capacity limit of a Shannon channel, such as a Turbo code, while continuously increasing a block length of the Block Code. MacKay and Neal have proven that the performance of an iterative decoding process of an LDPC code using a flow transfer scheme is approximate to an iterative decoding process of a Turbo Code.

In order to generate a high-performance LDPC code, the following conditions must be satisfied.

(1) Cycles on a factor graph of an LDPC code must be considered.

A cycle being long in length means that the number of edges connecting the variable nodes to the check nodes forming the loop in the factor graph of the LDPC code is large. In contrast, a cycle being short in length means that the number of edges connecting the variable nodes to the check nodes forming the loop in the factor graph of the LDPC code is small.

As cycles in the factor graph of the LDPC code become longer, the performance efficiency of the LDPC code increases for the following reasons. When long cycles are generated in the factor graph of the LDPC code, it is possible to prevent performance degradation such as an error floor occurring when too many cycles with a short length exist on the factor graph of the LDPC code.

(2) Efficient encoding of an LDPC code must be considered.

It is difficult for the LDPC code to undergo real-time encoding as compared with a Convolutional Code or a Turbo Code because of its high encoding complexity. To reduce the encoding complexity of the LDPC code, a Repeat Accumulate (RA) code has been proposed. However, the RA code also has a limitation in reducing the encoding complexity of the LDPC code. Therefore, consideration must be given to efficient encoding of the LDPC code.

(3) A degree distribution on a factor graph of an LDPC code must be considered.

Generally, an irregular LDPC code outperforms a regular LDPC code, because a factor graph of the irregular LDPC code has various degrees. The term "degree" refers to the number of edges connected to the nodes, i.e., the variable nodes and the check nodes, in the factor graph of the LDPC code. The phrase "degree distribution" on a factor graph of an LDPC code refers to a ratio of the number of nodes having a particular degree to the total number of nodes. It has been proven by Richardson that an LDPC code having a particular degree distribution is superior in performance.

However, no concrete channel interleaving/deinterleaving method based on characteristics of an LDPC code has been considered in the conventional communication system using the LDPC code. Accordingly, there exists a need exists for a concrete channel interleaving/deinterleaving method based on characteristics of an LDPC code in the conventional communication system using the LDPC code.

SUMMARY OF THE INVENTION

It is, therefore, an object of the present invention to provide a channel interleaving/deinterleaving apparatus in a communication system using a Low Density Parity Check (LDPC) code and a control method thereof.

It is another object of the present invention to provide a channel interleaving/deinterleaving apparatus in a communication system using a Low Density Parity Check (LDPC) code and a control method thereof that can minimize an error rate.

In accordance with an aspect of the present invention, there is provided by a channel interleaving apparatus in a communication system, including an encoder for encoding information data bits in a preset coding scheme when the information data bits are input, and generating a Low Density Parity Check (LDPC) codeword; a channel interleaver for interleaving the LDPC codeword according to a preset channel interleaving rule; and a modulator for modulating a channel-interleaved LDPC codeword in a preset modulation scheme and generating a modulation symbol.

In accordance with another aspect of the present invention, there is provided by a channel deinterleaving apparatus in a communication system, including a demodulator for demodulating a received signal in a demodulation scheme associated with a modulation scheme applied to a channel interleaving apparatus associated with the channel deinterleaving apparatus; a channel deinterleaver for deinterleaving the demodulated signal in a channel deinterleaving scheme associated with a channel interleaving scheme applied to the channel interleaving apparatus; and a decoder for decoding a channel-deinterleaved signal in a decoding scheme associated with a coding scheme of a Low Density Parity Check (LDPC) codeword applied to the channel interleaving apparatus and recovering information data bits.

In accordance with still another aspect of the present invention, there is provided by a channel interleaving method in a communication system including encoding information data bits in a preset coding scheme when the information data bits are input, and generating a Low Density Parity Check (LDPC) codeword; interleaving the LDPC codeword according to a preset channel interleaving rule; and modulating a channel-interleaved LDPC codeword in a preset modulation scheme and generating a modulation symbol.

In accordance with still yet another aspect of the present invention, there is provided by a channel deinterleaving method in a communication system, including demodulating a received signal in a demodulation scheme associated with a modulation scheme applied at a time of channel interleaving; deinterleaving the demodulated signal in a channel deinterleaving scheme associated with a channel interleaving scheme applied at the time of the channel interleaving; and decoding a channel-deinterleaved signal in a decoding scheme associated with a coding scheme of a Low Density Parity Check (LDPC) codeword applied at the time of the channel interleaving and recovering information data bits.

BRIEF DESCRIPTION OF THE DRAWINGS

The above and other objects, features and advantages of the present invention will be more clearly understood from the following detailed description when taken in conjunction with the accompanying drawings, in which.

DETAILED DESCRIPTION OF THE PREFERRED EMBODIMENTS

Hereinafter preferred embodiments of the present invention will be described in detail with reference to the accompanying drawings. In the following description of the present invention, detailed descriptions of known functions and configurations incorporated herein are omitted for clarity and conciseness.

The present invention provides a channel interleaving/deinterleaving apparatus in a communication system using a Low Density Parity Check (LDPC) code and a control method thereof that can minimize an error rate. Specifically, the present invention provides a channel interleaving/deinterleaving apparatus and a control method thereof that can maximize code performance through modulation symbol mapping and channel interleaving such that the error rate is minimized when an encoded LDPC codeword is modulated.

Figure 3:
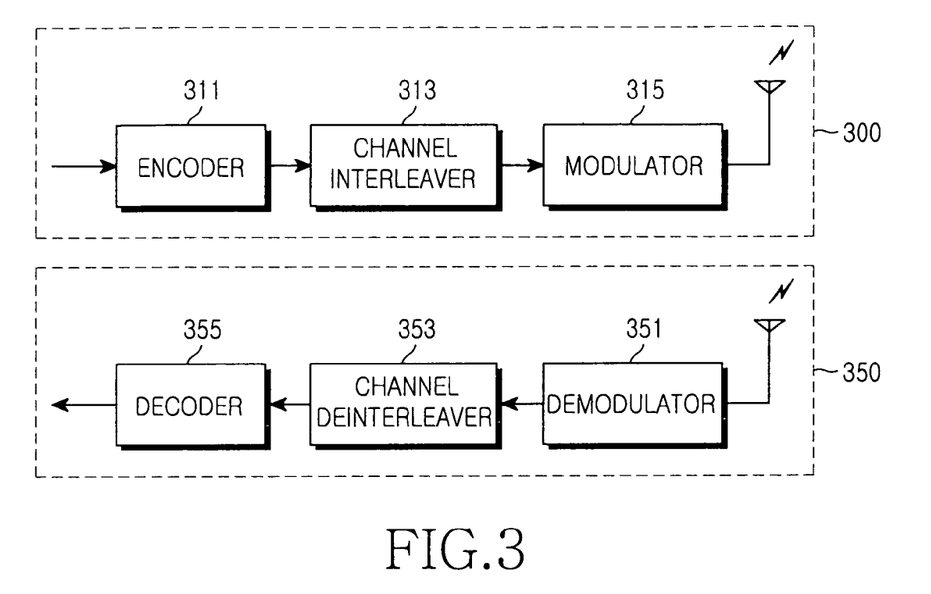
FIG. 3 is a schematic diagram illustrating a structure of a communication system using an LDPC code in accordance with the present invention.

FIG. 3 is a schematic diagram illustrating a structure of a communication system using an LDPC code in accordance with the present invention.

Referring to FIG. 3, the communication system is provided with a transmitter 300 and a receiver 350. The transmitter 300 includes an encoder 311, a channel interleaver 313, and a modulator 315. The receiver 350 includes a demodulator 351, a channel deinterleaver 353, and a decoder 355.

The transmitter 300 is described as follows.

When information data bits are input, they are transferred to the encoder 311. The encoder 311 receives the transferred information data bits, generates a codeword by encoding the information data bits in a preset coding scheme, and then outputs the generated codeword to the channel interleaver 313. Herein, the encoder 311 is an LDPC encoder, such that the codeword generated from the encoder 311 becomes an LDPC codeword.

The channel interleaver 313 receives the LDPC codeword output from the encoder 311. It interleaves the LDPC codeword in a preset channel-interleaving scheme, and outputs the interleaved LDPC codeword to the modulator 315. Herein, the channel interleaver 313 interleaves the LDPC codeword output from the encoder 311 in the channel interleaving scheme to prevent a burst error due to a number of factors including but not limited to fading. The channel interleaving operation of the channel interleaver 313 is performed according to a channel interleaver design rule of the present invention, which will be described below in more detail.

The modulator 315 modulates a signal output from the channel interleaver 313, i.e., a channel-interleaved LDPC codeword, in a preset modulation scheme, and transmits the modulated LDPC codeword to the receiver 350 through a Transmit Antenna (Tx. Ant). Herein, the channel interleaver 313 performs the channel interleaving operation such that the channel-interleaved LDPC codeword can be allocated to a modulation symbol to minimize an error rate when the modulation scheme is performed. The channel interleaver 313 is designed using characteristics in which the reliability differs between bits of the LDPC codeword according to cycle characteristics of the LDPC codeword, a weight distribution, and the degree of a variable node associated with a codeword bit. This will be described below in more detail.

The receiver 350 is described as follows.

A signal transmitted from the transmitter 300 is received through a Receive Antenna (Rx. Ant). The signal received through the Rx. Ant is transferred to the demodulator 351. The demodulator 351 demodulates the signal received through the Rx. Ant in a demodulation scheme associated with the modulation scheme applied in the modulator 315, and outputs the demodulated signal to the channel deinterleaver 353.

The channel deinterleaver 353 deinterleaves the signal output from the demodulator 351 in a channel-deinterleaving scheme associated with a channel-interleaving scheme applied in the interleaver 313 of the transmitter 300, and outputs the deinterleaved signal to the decoder 355. Herein, the channel deinterleaving operation of the channel deinterleaver 353 is also performed according to a channel interleaver design rule of the present invention. This will be described below in more detail.

The decoder 355 performs a decoding operation in a decoding scheme associated with a coding scheme applied in the encoder 311 of the transmitter 300 and recovers final information data bits.

Although it is not illustrated, a transmitter structure for processing and transmitting an Radio Frequency (RF) signal after the modulator 315 and a receiver structure for receiving and processing an RF signal before the demodulator 351 in FIG. 3, a signal output from the modulator 315 is transmitted after an RF signal processes through the transmitter 300 and a received signal after an RF signal processes through the receiver 350 is provided to the demodulator 351.

The structure of the communication system using the LDPC code in accordance with the present invention has been described with reference to FIG. 3. Next, a modulation constellation based on a conventional 16-Quadrature Amplitude Modulation (16 QAM) scheme will be described with reference to FIG. 4.

Figure 4:
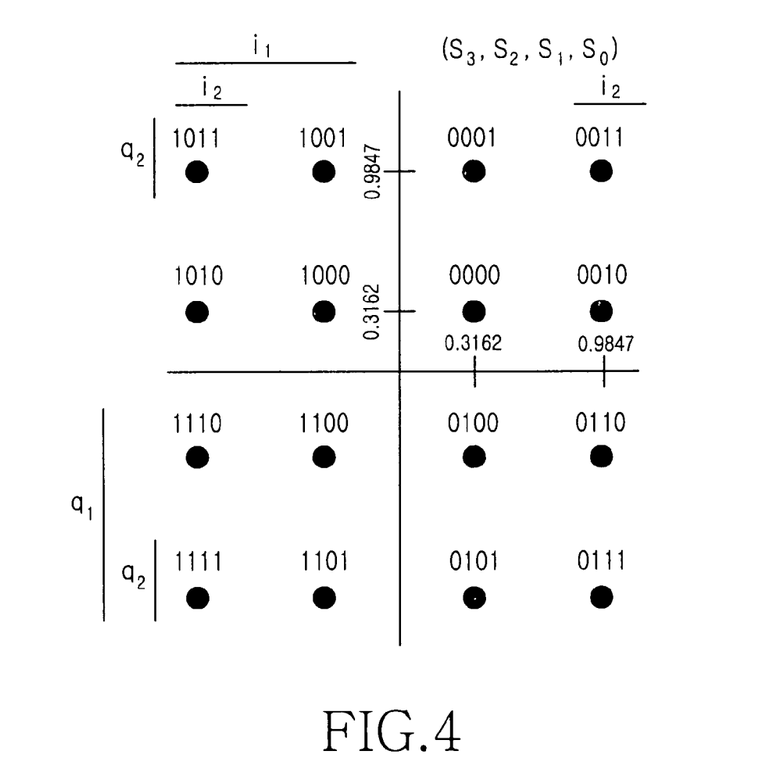
FIG. 4 illustrates a modulation constellation based on a conventional 16-Quadrature Amplitude Modulation (16 QAM) scheme.

FIG. 4 schematically illustrates the modulation constellation based on the conventional 16 QAM scheme.

As illustrated in FIG. 4, bits ($S_3$, $S_2$, $S_1$, $S_0$) mapped to one modulation symbol have different reliabilities. In FIG. 4, $i_1$ and $i_2$ having real values are mapped to $S_3$ and $S_1$ of the modulation symbol. Herein, the bit $S_3$ is mapped to have values of 0 and 1 symmetric with respect to the y-axis corresponding to the imaginary axis. However, the bit $S_1$ is mapped to have the value of 0 in a region adjacent to the y-axis and the value of 1 in a region far away from the y-axis. In the receiver, a probability in which 0 is detected as 1 is higher than a probability in which 1 is detected as 0. Due to asymmetry, a value mapped to the bit $S_1$ has a high error probability and therefore its reliability is degraded.

In FIG. 4, $q_1$ and $q_2$ having imaginary values are mapped to $S_2$ and $S_0$ of the modulation symbol. Because $S_2$ and $S_0$ are similar to $S_3$ and $S_1$, the reliability of $S_2$ is higher than that of $S_0$.

In the present invention, a channel interleaver is designed using unequal error characteristics of the above-described high-order modulation scheme. A Bit Error Rate (BER) per bit of an LDPC code in which a codeword length is 576 and a coding rate is ½ will be described with reference to FIG. 5.

Figure 5:
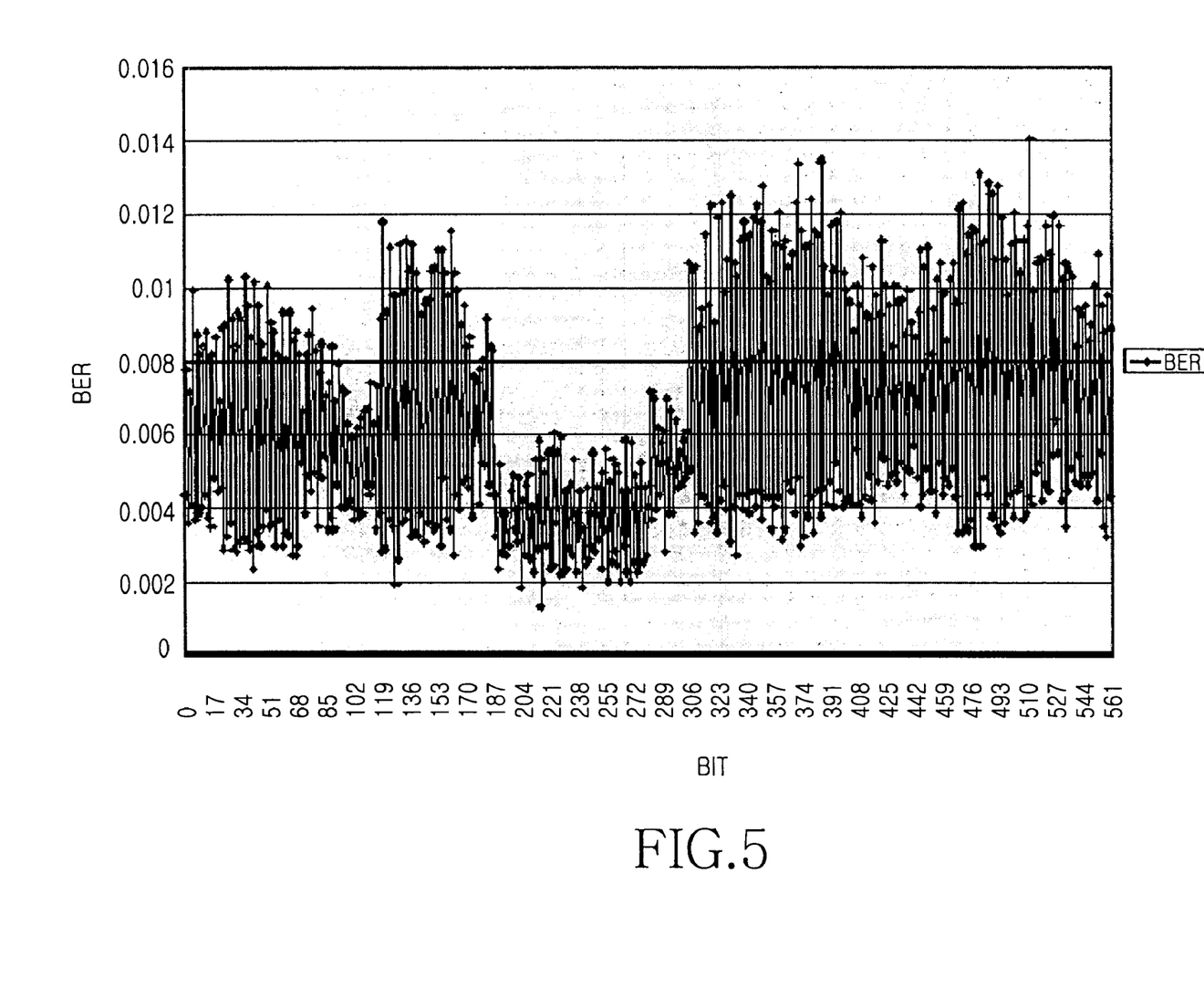
FIG. 5 is a graph illustrating a Bit Error Rate (BER) per bit of an LDPC code in which a codeword length is 576 and a coding rate is ½.

FIG. 5 is a graph illustrating a BER per bit of an LDPC code in which a codeword length is 576 and a coding rate is ½.

Referring to FIG. 5, the x-axis represents $1^{st}$ to $576^{th}$ bits mapped to $1^{st}$ to $576^{th}$ columns of a parity check matrix. Next, the y-axis represents BERs of the $1^{st}$ to $576^{th}$ bits.

In the LDPC code in which the codeword length is 576 and the coding rate is ½, the $1^{st}$ to $192^{nd}$ bits are mapped to a degree-3 variable node, the $193^{rd}$ to $288^{th}$ bits are mapped to a degree-6 variable node, and the remaining bits are mapped to a degree-2 or 3 variable node. Herein, the degree of the variable node corresponds to a weight of an associated column and the term "weight" refers to the number of elements having a non-zero value among elements forming a generation matrix and a parity check matrix of the LDPC code.

From FIG. 5, it can be seen that the BERs of the $1^{st}$ to $192^{nd}$ bits and the $289^{th}$ to $576^{th}$ bits mapped to a low-degree variable node are higher than those of the $193^{rd}$ to $288^{th}$ bits mapped to a high-degree variable node. From FIG. 5, it can be seen that a BER is different because a cycle size and the number of cycles in a cycle structure coupled to each node are different even in bits mapped to an identical degree variable node.

The LDPC code can be decoded using an iterative decoding algorithm based on a sum-product algorithm on a factor graph. In characteristics of the sum-product algorithm, the reliability of each encoded bit is affected by a cycle structure. Many bits coupled to a cycle of a short length have a low reliability. Accordingly, a mean cycle value is used as a criterion for measuring the reliability. The mean cycle value can be computed by dividing a sum of lengths of all cycles coupled to variable nodes of an associated factor graph mapped to encoded bits by the number of cycles. As a result, the reliability of an encoded bit of a variable node associated with a small mean cycle value is low, and the reliability of an encoded bit of a variable node associated with a large mean cycle value is high.

The reliability of the LDPC code is also affected by the number of check nodes coupled to a variable node, i.e., the degree of the variable node. The reliability of an encoded bit mapped to a high-degree variable node is high.

Therefore, the present invention provides a channel interleaver of the LDPC code by considering the cycle size and the characteristics of the node degree. Channel interleaver design rules are as follows.

Channel Interleaver Design Rules

Rule 1: A variable node of a low degree having a low reliability is mapped to a bit having high reliability among bits of the modulation symbol.

Rule 2: A variable node with a short mean cycle length is mapped to mapped to a bit with a high reliability among bits of the modulation symbol. Herein, the mean cycle indicates a value obtained by dividing a sum of lengths of all cycles coupled to variable nodes by the total number of all cycles.

Rule 3: Variable nodes forming one short cycle are set to have a preset distance value (d) or greater A cycle of a short length is a cycle of less than a preset length. For example, the preset length may be less than a cycle 8.

A detailed description of Rule 1 is set forth as follows.

Variable nodes with a low degree in a component codeword, i.e., in an LDPC codeword, are mapped to bits of a high reliability within the modulation symbol, such that the reliability can be further improved, thereby improving the BER characteristics. That is, it is possible to improve the reliability of variable nodes in which an error frequently occurs between coded bits of the LDPC codeword.

A detailed description of Rule 2 is set forth as follows.

A practical communication system does not need to detect all cycles of the LDPC codeword in order to apply Rule 2. As such, the communication system detects only the cycles with a short length (for example, shorter than a 10 cycle length), and variable nodes having many cycles with a short length are mapped to bits of a high reliability within the modulation symbol.

A detailed description of Rule 3 is set forth as follows.

Again, variable nodes coupled to the cycles of a short length have a low reliability. Therefore, Rule 3 includes the variable nodes in different cycles to improve reliability of the variable nodes, thereby reducing dependency of the respective variable nodes. Variable nodes coupled to cycles of a short length are in a short distance on the factor graph. Consequently, they are maximally separated from each other on the LDPC codeword. The reason why the variable nodes coupled to cycles of a short length are maximally separated from each other on the LDPC codeword is that bits with a low reliability can be prevented from being successively generated in a channel in which a burst error occurs as in a fading channel. Therefore, the reliability of associated bits is improved.

In order to improve the performance of an LDPC code, it is preferred that a degree distribution exhibiting optimal performance is implemented using a density evolution scheme. Understandably, it is difficult that an LDPC code with a degree distribution exhibiting the optimal performance is implemented and also all the channel interleaver design rules based on Rule 1 to Rule 3 are applied due to various constraints in a cycle structure on the factor graph and hardware implementation. However, it is preferred that the performance is improved, if possible, by using the channel interleaver design rules. Inasmuch as an operation for computing a degree distribution with the optimal performance using the density evolution scheme is not directly related to the present invention, a detailed description thereof will be omitted herein.

The channel interleaver design rule based on Rule 1 will be described below with reference to FIG. 6.

Figure 6:
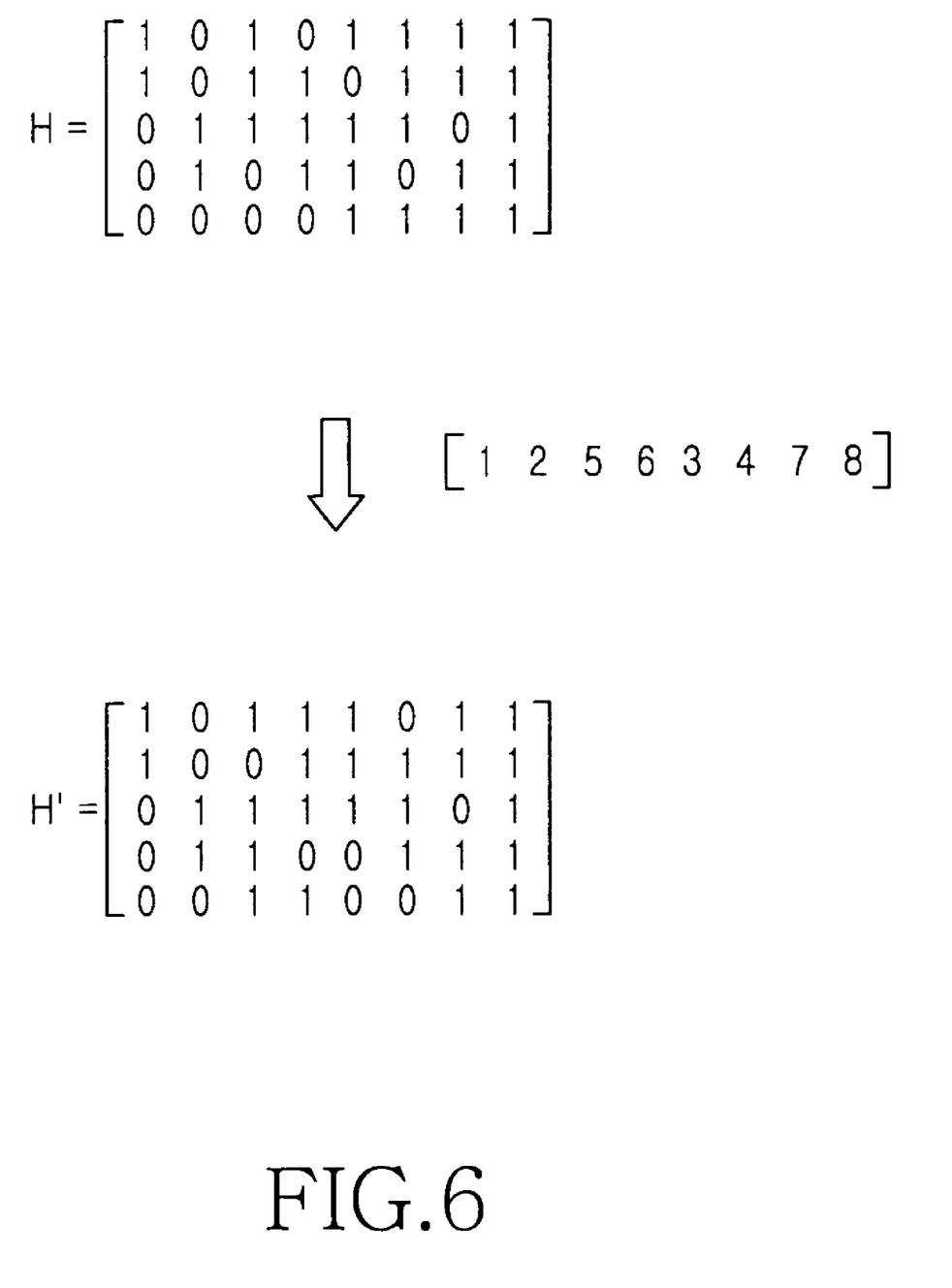
FIG. 6 is a schematic illustrating a channel interleaver design rule based on Rule 1 proposed by the present invention.

FIG. 6 schematically illustrates the channel interleaver design rule based on Rule 1 of the present invention.

Before a description of FIG. 6 is given, it is assumed that a parity check matrix H includes $1^{st}$ to $4^{th}$ columns with a low degree and $5^{th}$ to $8^{th}$ columns with a high degree when the parity check matrix is defined as H. Assuming that the 16 QAM scheme is applied to the communication system using the LDPC code as illustrated in FIG. 4, the reliability of bits $S_3$ and $S_2$ of a modulation symbol is higher than that of bits $S_1$ and $S_0$ of the modulation symbol. According to the channel interleaver design rue of Rule 1, $1^{st}$ to $4^{th}$ bits mapped to a variable node with a low degree are mapped to $S_1$ and $S_0$ with a high reliability, and $5^{th}$ to $8^{th}$ bits mapped to a variable node with a high degree are mapped to $S_3$ and $S_2$ with a low reliability.

When the 3 to 6 h bits of the parity check matrix H are interleaved, Rule 1 of the channel interleaver design rule can be satisfied. That is, $1^{st}$, $2^{nd}$, $3^{rd}$, $4^{th}$, $5^{th}$, $6^{th}$, $7^{th}$, and $8^{th}$ columns of the parity check matrix H are permutated, such that a new parity check matrix H' formed by $1^{st}$, $2^{nd}$, $5^{th}$, $6^{th}$, $3^{rd}$, $4^{th}$, $7^{th}$, and $8^{th}$ columns is generated. When a channel interleaving process is performed for the new parity check matrix H', the BER is minimized and the performance of the LDPC code is improved. As a result, a Channel Interleaving function (CI) is defined as Equation (1) below.

$$CI=[12563478] \quad (1)$$

The channel interleaver design rule based on Rule 1 of the present invention has been described with reference to FIG. 6. Next, channel interleaver design rules based on Rule 2 and Rule 3 of the present invention will be described with reference to FIG. 7.

Figure 7:
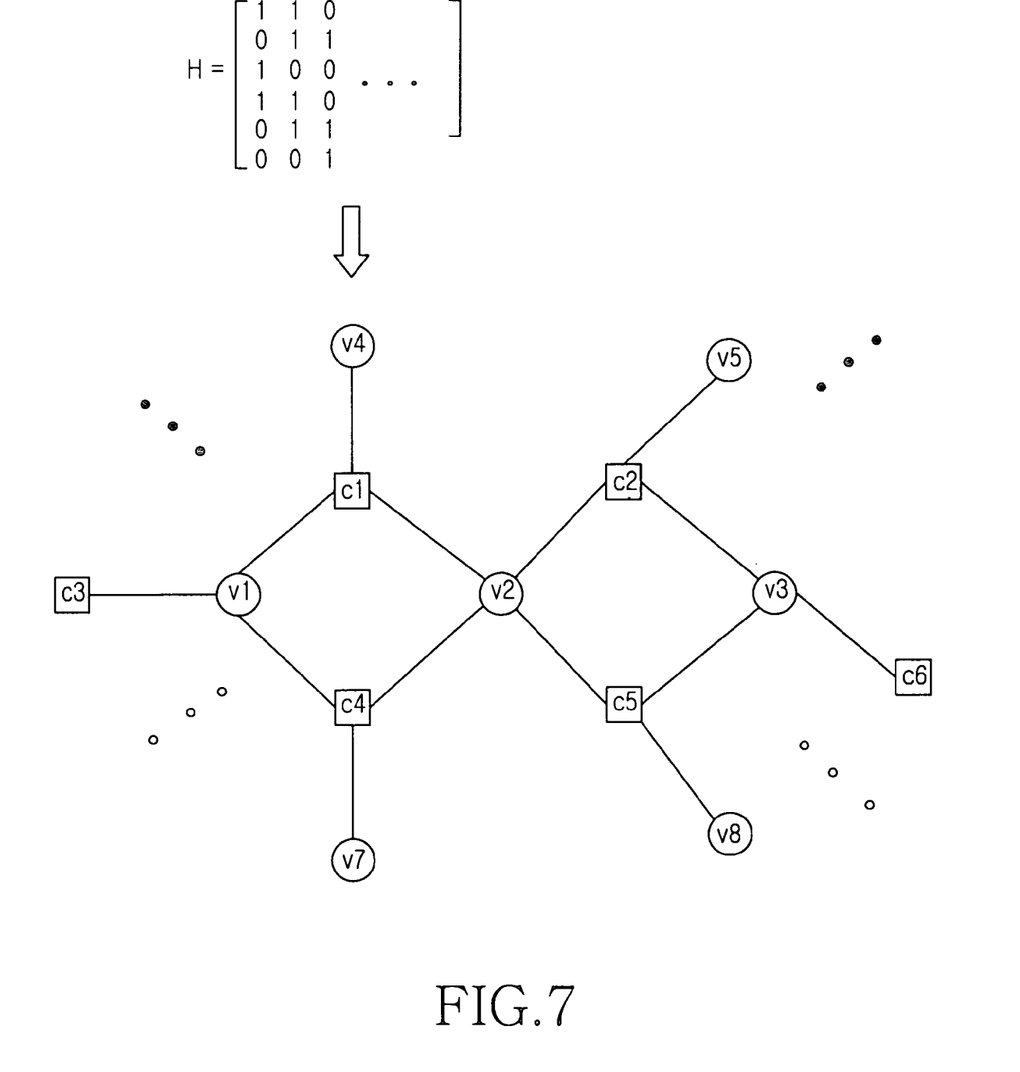
FIG. 7 is a schematic diagram illustrating channel interleaver design rules based on Rule 2 and Rule 3 proposed by the present invention.

FIG. 7 is a schematic diagram illustrating the channel interleaver design rules based on Rule 2 and Rule 3 of the present invention.

Referring to FIG. 7, a parity check matrix H has a parity check matrix in which variable nodes v1, v2, and v3, i.e., $1^{st}$ to $3^{rd}$ columns, have a structure of a cycle 4 as illustrated in a factor graph. According to Rule 2 of the channel interleaver design rules, variable nodes with a short cycle are mapped to $S_3$ and $S_2$ with a high reliability. Herein, two variable nodes v1 and v2 or v2 and v3 coupled to the same cycle 4 are separated by a preset distance d or more from each other after channel interleaving according to Rule 3 of the channel interleaver design rules. The preset distance d is determined by a block size of the LDPC code, i.e., a codeword length.

The present invention improves the reliability of an LDPC code by considering unequal reliability characteristics and controlling a channel interleaving process in a communication system using the LDPC code. Specifically, the present invention improves the reliability by both performing the channel interleaving process for bits with a low reliability among bits constructing the LDPC code and enhancing the robustness of a radio channel environment with a high probability in which a burst error occurs as in a fading channel. Transmission and reception of a reliable LDPC code can reduce an error rate of the overall system and enable reliable communications at a high rate.

While the present invention has been shown and described with reference to certain preferred embodiments thereof, it will be understood that those skilled in the art will appreciate that various modifications, additions, and substitutions are possible, without departing from the scope and spirit of the present invention as disclosed in the accompanying claims, including the full scope of equivalents thereof.

What is claimed is:

1. A transmitter in a communication system, comprising:
   an encoder for encoding information data bits in a preset coding scheme, and generating a Low Density Parity Check (LDPC) codeword;
   a channel interleaver for interleaving the LDPC codeword according to a preset channel interleaving rule; and
   a modulator for modulating a channel-interleaved LDPC codeword in a preset modulation scheme and generating a modulation symbol,
   wherein the channel interleaving rule maps a variable node with a low degree in a factor graph of the LDPC codeword to a bit with a high reliability among bits of the modulation symbol, the low degree being less than a preset degree, and the high reliability being equal to or greater than a preset reliability.

2. The transmitter of claim 1, wherein the channel interleaving rule maps a variable node with a mean cycle of a short length in a factor graph of the LDPC codeword to a bit with a high reliability among bits of the modulation symbol.

3. The transmitter of claim 2, wherein the mean cycle is a value obtained by dividing a sum of lengths of all cycles coupled to the variable node in the factor graph of the LDPC codeword by a number of all the cycles.

4. A transmitter in a communication system, comprising:
   an encoder for encoding information data bits in a preset coding scheme, and generating a Low Density Parity Check (LDPC) codeword;
   a channel interleaver for interleaving the LDPC codeword according to a preset channel interleaving rule; and
   a modulator for modulating a channel-interleaved LDPC codeword in a preset modulation scheme, and generating a modulation symbol,
   wherein the channel interleaving rule sets variable nodes with a preset distance or greater in the LDPC codeword for which channel interleaving is performed, the variable nodes forming a cycle of less than a preset length in a factor graph of the LDPC codeword.

5. The transmitter of claim 4, wherein the preset distance is determined by a block size of the LDPC code.

6. A transmitter in a communication system, comprising:
   an encoder for encoding information data bits in a preset coding scheme, and generating a Low Density Parity Check (LDPC) codeword;
   a channel interleaver for interleaving the LDPC codeword according to a preset channel interleaving rule; and
   a modulator for modulating a channel-interleaved LDPC codeword in a preset modulation scheme, and generating a modulation symbol,
   wherein the channel interleaving rule maps a variable node with a low degree in a factor graph of the LDPC codeword to a bit with a high reliability among bits of the modulation symbol, maps the variable node with a mean cycle of a short length in the factor graph of the LDPC codeword to a bit with a high reliability among the bits of the modulation symbol, and sets variable nodes with a preset distance or greater in the LDPC codeword for which channel interleaving is performed, the variable nodes forming a cycle of less than a preset length in the factor graph of the LDPC codeword,
   wherein the low degree is less than a preset degree, the high reliability is equal to or greater than a preset reliability, and the short length is less than a preset length, and
   wherein the mean cycle is a value obtained by dividing a sum of lengths of all cycles coupled to the variable nodes in the factor graph of the LDPC codeword by a number of all the cycles.

7. The transmitter of claim 6, wherein the preset distance is determined by a block size of the LDPC code.

8. A signal transmission method in a communication system, comprising:
   encoding information data bits in a preset coding scheme;
   generating a Low Density Parity Check (LDPC) codeword;
   interleaving the LDPC codeword according to a preset channel interleaving rule;
   modulating a channel-interleaved LDPC codeword in a preset modulation scheme; and
   generating a nodulation symbol,
   wherein the channel interleaving rule maps a variable node with a low degree in a factor graph of the LDPC codeword to a bit with a high reliability among bits of the modulation symbol, the low degree being less than a preset degree, and the high reliability being equal to or greater than a preset reliability.

9. A signal transmission method in a communication system, comprising:
   encoding information data bits in a preset coding scheme;
   generating a Low Density Parity Check (LDPC) codeword;

interleaving the LDPC codeword according to a preset channel interleaving rule;

modulating a channel-interleaved LDPC codeword in a preset modulation scheme; and generating a modulation symbol, wherein the channel interleaving rule maps a variable node with a mean cycle of a short length in a factor graph of the LDPC codeword to a bit with a high reliability among bits of the modulation symbol, the low degree being less than a preset degree, and the high reliability being equal to or greater than a preset reliability, and wherein the mean cycle is a value obtained by dividing a sum of lengths of all cycles coupled to the variable nodes in the factor graph of the LDPC codeword by a number of all the cycles.

10. A signal transmission method in a communication system, comprising:

encoding information data bits in a preset coding scheme;
generating a Low Density Parity Check (LDPC) codeword;
interleaving the LDPC codeword according to a preset channel interleaving rule;
modulating a channel-interleaved LDPC codeword in a preset modulation scheme; and
generating a modulation symbol,
wherein the channel interleaving rule sets variable nodes with a preset distance or greater in the LDPC codeword for which channel interleaving is performed, the variable nodes forming a cycle of less than a preset length in a factor graph of the LDPC codeword.

11. The signal transmission method of claim 10, wherein the preset distance is determined by a block size of the LDPC code.

12. A signal transmission method in a communication system, comprising:

encoding information data bits in a preset coding scheme;
generating a Low Density Parity Check (LDPC) codeword;
interleaving the LDPC codeword according to a preset channel interleaving rule;
modulating a channel-interleaved LDPC codeword in a preset modulation scheme; and
generating a modulation symbol,
wherein the channel interleaving rule maps a variable node with a low degree in a factor graph of the LDPC codeword to a bit with a high reliability among bits of the modulation symbol, maps a variable node with a mean cycle of a short length in the factor graph of the LDPC codeword to a bit with a high reliability among the bits of the modulation symbol, and sets variable nodes with a preset distance or greater in the LDPC codeword for which channel interleaving is performed, the variable nodes forming a cycle of less than a preset length in the factor graph of the LDPC codeword
wherein the low degree is less than a preset degree, the high reliability is equal to or greater than a preset reliability, and the short length is less than a preset length, and
wherein the mean cycle is a value obtained by dividing a sum of lengths of all cycles coupled to the variable nodes in the factor graph of the LDPC codeword by a number of all the cycles.

13. The signal transmission method of claim 12, wherein the preset distance is determined by a block size of the LDPC code.

14. A receiver in a communication system, comprising:

a demodulator for demodulating a received signal in a demodulation scheme associated with a modulation scheme applied to a transmitter associated with the receiver;

a channel deinterleaver for deinterleaving the demodulated signal in a channel deinterleaving rule associated with a channel interleaving rule applied to the transmitter; and a decoder for decoding a channel-deinterleaved signal in a decoding scheme associated with a coding scheme of a Low Density Parity Check (LDPC) codeword applied to the transmitter and recovering information data bits, wherein a channel interleaving rule mans a variable node with a low degree in a factor graph of the LDPC codeword to a bit with a high reliability among bits of a modulation symbol, the modulation symbol being generated in the modulation scheme after the information data bits are encoded in the coding scheme, the low degree being less than a preset degree, and the high reliability being equal to or greater than a preset reliability.

15. A receiver in a communication system, comprising:

a demodulator for demodulating a received signal in a demodulation scheme associated with a modulation scheme applied to a transmitter associated with the receiver;

a channel deinterleaver for deinterleaving the demodulated signal in a channel deinterleaving rule associated with a channel interleaving rule applied to the transmitter; and a decoder for decoding a channel-deinterleaved signal in a decoding scheme associated with a coding scheme of a Low Density Parity Check (LDPC) codeword applied to the transmitter and recovering information data bits, wherein a channel interleaving rule maps a variable node with a mean cycle of a short length in a factor graph of the LDPC codeword to a bit with a high reliability among bits of a modulation symbol, the modulation symbol being generated in the modulation scheme after the information data bits are encoded in the coding scheme, wherein the high reliability is equal to or greater than a preset reliability, and the short length is less than a preset length, and wherein the mean cycle is a value obtained by dividing a sum of lengths of all cycles coupled to the variable nodes in the factor graph of the LDPC codeword by a number of all the cycles.

16. A receiver in a communication system, comprising:

a demodulator for demodulating a received signal in a demodulation scheme associated with a modulation scheme applied to a transmitter associated with the receiver;

a channel deinterleaver for deinterleaving the demodulated signal in a channel deinterleaving rule associated with a channel interleaving rule applied to the transmitter; and a decoder for decoding a channel-deinterleaved signal in a decoding scheme associated with a coding scheme of a Low Density Parity Check (LDPC) codeword applied to the transmitter and recovering information data bits, wherein a channel interleaving rule sets variable nodes with a preset distance or greater in the LDPC codeword for which channel interleaving is performed, the variable nodes forming a cycle of less than a preset length in a factor graph of the LDPC codeword, and wherein a modulation symbol is generated in the modulation scheme after the information data bits are encoded in the coding scheme.

17. The receiver of claim 16, wherein the preset distance is determined by a block size of the LDPC code.

18. A receiver in a communication system, comprising:
a demodulator for demodulating a received signal in a demodulation scheme associated with a modulation scheme applied to a transmitter associated with the receiver;
a channel deinterleaver for deinterleaving the demodulated signal in a channel deinterleaving rule associated with a channel interleaving rule applied to the transmitter; and
a decoder for decoding a channel-deinterleaved signal in a decoding scheme associated with a coding scheme of a Low Density Parity Check (LDPC) codeword applied to the transmitter and recovering information data bits,
wherein a channel interleaving rule maps a variable node with a low degree in a factor graph of the LDPC codeword to a bit with a high reliability among bits of a modulation symbol, maps a variable node with a mean cycle of a short length in the factor graph of the LDPC codeword to a bit with a high reliability among the bits of the modulation symbol, and sets variable nodes with a preset distance or greater in the LDPC codeword for which channel interleaving is performed, the variable nodes forming a cycle of less than a preset length in the factor graph of the LDPC codeword, and wherein the modulation symbol is generated in the modulation scheme after the information data bits are encoded in the coding scheme,
wherein the low degree is less than a preset degree, the high reliability is equal to or greater than a preset reliability, and the short length is less than a preset length, and
wherein the mean cycle is a value obtained by dividing a sum of lengths of all cycles coupled to the variable nodes in the factor graph of the LDPC codeword by a number of all the cycles.

19. The receiver of claim 18, wherein the preset distance is determined by a block size of the LDPC code.

20. A signal reception method in a communication system, comprising:
demodulating a received signal in a demodulation scheme associated with a modulation scheme applied at a time of channel interleaving;
deinterleaving a demodulated signal in a channel deinterleaving rule associated with the channel interleaving rule applied at the time of the channel interleaving;
decoding the channel-deinterleaved signal in a decoding scheme associated with a coding scheme of a Low Density Parity Check (LDPC) codeword applied at the time of the channel interleaving; and
recovering information data bits,
wherein a channel interleaving rule maps a variable node with a low degree in a factor graph of the LDPC codeword to a bit with a high reliability among bits of a modulation symbol, the modulation symbol being generated in the modulation scheme after the information data bits are encoded in the coding scheme, the low degree being less than a preset degree, and the high reliability being equal to or greater than a preset reliability.

21. A signal reception method in a communication system, comprising:
demodulating a received signal in a demodulation scheme associated with a modulation scheme applied at a time of channel interleaving;
deinterleaving a demodulated signal in a channel deinterleaving rule associated with the channel interleaving rule applied at the time of the channel interleaving;
decoding the channel-deinterleaved signal in a decoding scheme associated with a coding scheme of a Low Density Parity Check (LDPC) codeword applied at the time of the channel interleaving; and
recovering information data bits,
wherein a channel interleaving rule maps a variable node with a mean cycle of a short length in a factor graph of the LDPC codeword to a bit with a high reliability among bits of a modulation symbol, the modulation symbol being generated in the modulation scheme after the information data bits are encoded in the coding scheme,
wherein the high reliability is equal to or greater than a preset reliability, and the short length is less than a preset length, and
wherein the mean cycle is a value obtained by dividing a sum of lengths of all cycles coupled to the variable nodes in the factor graph of the LDPC codeword by a number of all the cycles.

22. A signal reception method in a communication system, comprising:
demodulating a received signal in a demodulation scheme associated with a modulation scheme applied at a time of channel interleaving;
deinterleaving a demodulated signal in a channel deinterleaving rule associated with the channel interleaving rule applied at the time of the channel interleaving;
decoding the channel-deinterleaved signal in a decoding scheme associated with a coding scheme of a Low Density Parity Check (LDPC) codeword applied at the time of the channel interleaving; and
recovering information data bits,
wherein a channel interleaving rule sets variable nodes with a preset distance or greater in the LDPC codeword for which the channel interleaving is performed, the variable nodes forming a cycle of less than a preset length in a factor graph of the LDPC codeword, and wherein a modulation symbol is generated in the modulation scheme after the information data bits are encoded in the coding scheme.

23. The signal reception method of claim 22, wherein the preset distance is determined by a block size of the LDPC code.

24. A signal reception method in a communication system, comprising:
demodulating a received signal in a demodulation scheme associated with a modulation scheme applied at a time of channel interleaving;
deinterleaving a demodulated signal in a channel deinterleaving rule associated with the channel interleaving rule applied at the time of the channel interleaving;
decoding the channel-deinterleaved signal in a decoding scheme associated with a coding scheme of a Low Density Parity Check (LDPC) codeword applied at the time of the channel interleaving; and
recovering information data bits,
wherein a channel interleaving rule maps a variable node with a low degree in a factor graph of the LDPC codeword to a bit with a high reliability among bits of a modulation symbol, maps a variable node with a mean cycle of a short length in the factor graph of the LDPC codeword to a bit with a high reliability among the bits of the modulation symbol, and sets variable nodes with a preset distance or greater in the LDPC codeword for which the channel interleaving is performed, the variable nodes forming a cycle of less than a preset length in the factor graph of the LDPC codeword, and wherein the modulation symbol is generated in the modulation scheme after the information data bits are encoded in the coding scheme, wherein the low degree is less than a preset degree, the high reliability is equal to or greater than a preset reliability, and the short length is less than a preset length, and wherein the mean cycle is a value obtained by dividing a sum of lengths of all cycles coupled to the variable nodes in the factor graph of the LDPC codeword by a number of all the cycles.

25. The signal reception method of claim 24, wherein the preset distance is determined by a block size of the LDPC code.

* * * * *